(12) United States Patent
Yoon et al.

(10) Patent No.: US 7,811,893 B2
(45) Date of Patent: Oct. 12, 2010

(54) SHALLOW TRENCH ISOLATION STRESS ADJUSTER FOR MOS TRANSISTOR

(75) Inventors: Jong Shik Yoon, Plano, TX (US); Andrew Tae Kim, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/489,344

(22) Filed: Jun. 22, 2009

(65) Prior Publication Data
US 2009/0258468 A1    Oct. 15, 2009

Related U.S. Application Data

(63) Continuation of application No. 10/825,343, filed on Apr. 15, 2004, now abandoned.

(51) Int. Cl.
*H01L 21/76* (2006.01)
(52) U.S. Cl. .............. 438/296; 438/424; 257/E21.409; 257/E21.546
(58) Field of Classification Search .............. 438/296, 438/424
See application file for complete search history.

(56) References Cited

U.S. PATENT DOCUMENTS

| | | | |
|---|---|---|---|
| 5,909,628 A | 6/1999 | Chatterjee et al. | |
| 6,297,128 B1 | 10/2001 | Kim et al. | |
| 7,019,380 B2 * | 3/2006 | Sanuki | 257/513 |
| 7,129,139 B2 | 10/2006 | Murthy et al. | |
| 7,442,618 B2 * | 10/2008 | Chong et al. | 438/424 |
| 7,470,973 B2 * | 12/2008 | Takao | 257/627 |
| 7,615,840 B2 * | 11/2009 | Hampp et al. | 257/506 |
| 2003/0032272 A1 | 2/2003 | Mandelman et al. | |

OTHER PUBLICATIONS

Stanley Wolf, "Silicon Processing for the VSLI Era", vol. 4, Lattice Press 2000, p. 459.

* cited by examiner

*Primary Examiner*—Thanh Nguyen
(74) *Attorney, Agent, or Firm*—Warren L. Franz; Wade J. Brady, III; Frederick J. Telecky, Jr.

(57) ABSTRACT

The present invention provides, in one embodiment, a method of manufacturing a metal oxide semiconductor (MOS) transistor (100). The method comprises forming an active area (105) in a substrate (115), wherein the active area (105) is bounded by an isolation structure (120). The method further includes placing at least one stress adjuster (130) adjacent the active area (105), wherein the stress adjuster (130) is positioned to modify a mobility of a majority carrier within a channel region (155) of the MOS transistor (100). Other embodiments of the present invention include a MOS transistor device (200) and a process (300) for constructing an integrated circuit.

9 Claims, 7 Drawing Sheets

SHALLOW TRENCH ISOLATION STRESS ADJUSTER FOR MOS TRANSISTOR

This is a continuation of U.S. application Ser. No. 10/825,343 filed Apr. 15, 2004, the entirety of which is incorporated herein by reference.

BACKGROUND

This is directed, in general, to the manufacture of semiconductor devices.

The continuing push to produce faster semiconductor devices with lower power consumption has resulted in transistor miniaturization and higher integrated circuit packing densities with each new technology node. Moreover, transistors with smaller gate dimensions and channel width and higher packing density are conducive to faster operating devices. Along with shrinking transistor geometries, however, come a number of challenges to optimize both transistor design and integrated circuit (IC) layout design.

IC layout design involves determining the optimal placement and packing of active and passive areas over a silicon substrate, typically with the assistance of a rules based computer-aided design (CAD) programs. Active areas are defined as regions of the silicon substrate on which operative components are built, such as transistors, capacitors and resistors. Some active areas, also known as diffusion regions, are n-doped or p-doped to form transistors. To prevent conduction or crosstalk between active areas, the individual active areas are bounded by passive areas, referred to as isolation structures. Isolation structures are usually formed by filling trenches etched in the substrate with an insulator, such as silicon dioxide. In addition, other non-operative areas of the silicon substrate known as active dummy areas, which may not be doped, are distributed throughout the IC layout to help ensure that a planar surface is formed during chemical-mechanical polishing.

Numerous design rules are used to decide the dimension and relative location of active areas, passive areas and active dummy areas. For instance, transistors are designed by overlapping an active area and a polysilicon layer. The polysilicon layer can be used to form the gate electrode for one or more transistors, as well as to interconnect layers. Conventional design rules consider the minimum amount that the gate must overlap the active area ("gate overlap"), and the minimum amount that the active area must overlap the gate ("active overlap"). The rule for minimum active overlap ensures that there is an adequate area to form contacts to source/drain structures in the active area, and to maintain electrical isolation between the contacts and the gate. Still other design rules, based on transistor channel length and width dimensions, are used to predict the transistor performance characteristics, such as the on current ($I_{on}$), threshold voltage ($V_{th}$) and off drive current ($I_{off}$). For example, the transistor expected performance may be modified to better interface with other active areas by adjusting the channel length and width, by adjusting the gate dimensions.

Conventional design rules also ensure that active dummy areas are not too close to active areas. As an example, current technology nodes may call for a minimum separation distance between active areas and passive areas of between 1000 and 2000 nanometers. In addition, there are also design rules to restrict the placement of active dummy areas near polysilicon or other gate structures, to reduce parasitic capacitance. Parasitic capacitance can be further reduced by restricting the shape of active dummy areas to be pillars instead of one large continuous block. Typically, active dummy areas have variable size, shape and location relative to active areas for different areas of the substrate.

Unfortunately, conventional design rules can produce transistors whose predicted and actual performance characteristics differ markedly. Moreover, the trend is for the disparity between predicted and actual performance to increase as the transistor dimensions are scaled down and circuit density is increased. A deviation between predicted and actual performance can cause IC malfunction. To correct these deviations, it may be necessary to redesign the IC layout. These complexities, in turn, can increase manufacturing costs and delay the production of ICs.

Accordingly, what is needed is an improved method of manufacturing transistors and integrated circuits with predictable performance characteristics and high transistor packing densities, while not suffering the deficiencies of previous approaches.

SUMMARY

One embodiment of the invention is a method of manufacturing a metal oxide semiconductor (MOS) transistor. The method includes forming an active area in a silicon substrate. The active area is bounded by an isolation structure. The method also includes placing at least one stress adjuster adjacent the active area. The stress adjuster is positioned to modify a mobility of a majority carrier within a channel region of the MOS transistor.

Another embodiment of the invention is a MOS transistor. The MOS transistor comprises an active area in a substrate and an isolation structure. The isolation structure is in the substrate and surrounding the active area. The MOS transistor also includes at least one stress adjuster adjacent the active area. The stress adjuster is positioned to modify a mobility of a majority carrier within a channel region of the MOS transistor.

Still another embodiment of the invention is a method of constructing an integrated circuit (IC). The method includes generating a mask layout for the IC and using the mask layout to fabricate the IC. Generating the mask layout includes calculating an active overlap distance between a planned perimeter of a gate of the IC and a planned perimeter of an active area of the IC. A compressive stress along a direction of an intended current flow through a planned channel of the IC is determined based on the active overlap distance. A stress adjuster is introduced adjacent the active area to modify a mobility of a majority carrier through the planned channel, if the compressive stress is greater than a critical stress parameter.

BRIEF DESCRIPTION OF THE DRAWINGS

Embodiments of the invention are described with reference to accompanying drawings, wherein.

DETAILED DESCRIPTION OF EXAMPLE EMBODIMENTS

The invention recognizes that as the transistor device dimensions are scaled down, compressive stress from the isolation structure surrounding a transistor can substantially affect the mobility of majority carriers through the transistor channel region. For NMOS transistors, compressive stress in the direction of current flow through the channel can decrease the mobility of electrons in the channel. Conversely, for PMOS transistors, compressive stress in the direction of current flow can enhance the mobility of holes through the channel. This leads to the realization that active overlap is an important design parameter affecting the performance characteristics of transistors. For transistors whose active overlap reaches a certain critical small value, the amount of stress imparted to the transistor channel can be advantageously modified. In particular, stress adjusting structure can be introduced adjacent the active area, to either increase or decrease the compressive stress to adjust channel mobility as desired.

Figure 1A:
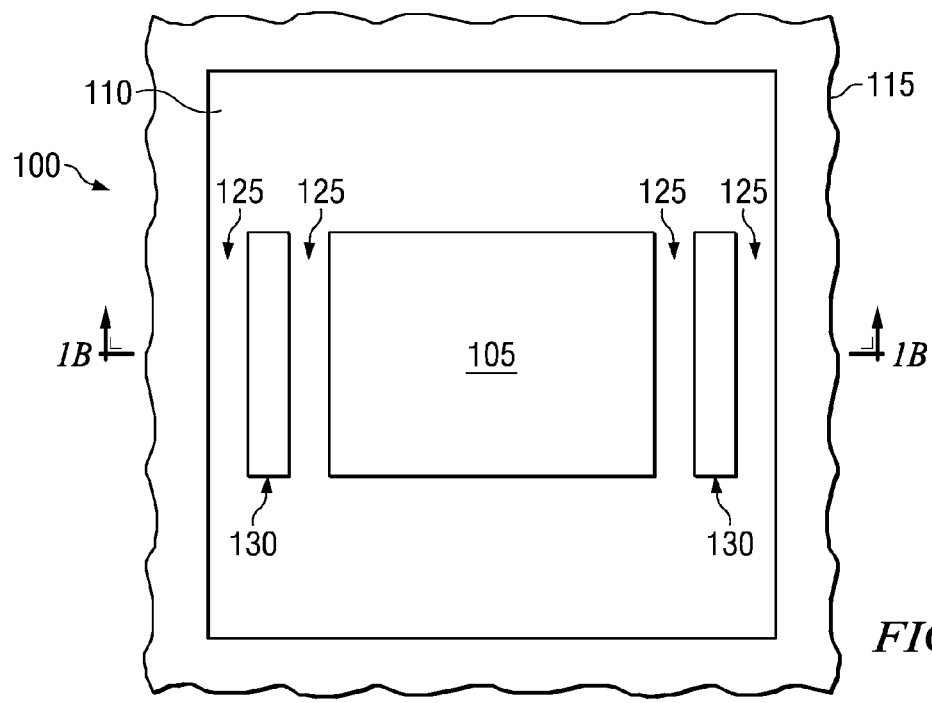
FIGS. 1A-1N illustrate partial sectional and plan views of selected steps in a method for manufacturing a MOS device according to principles of the invention.
Figure 1B:
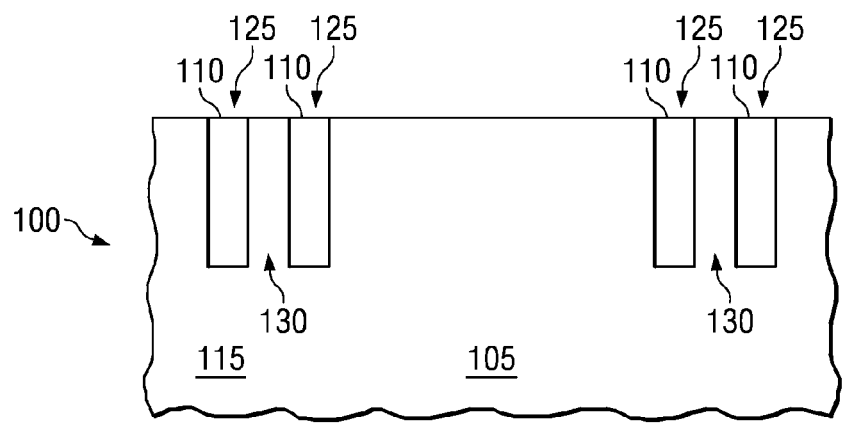
Figure 1D:
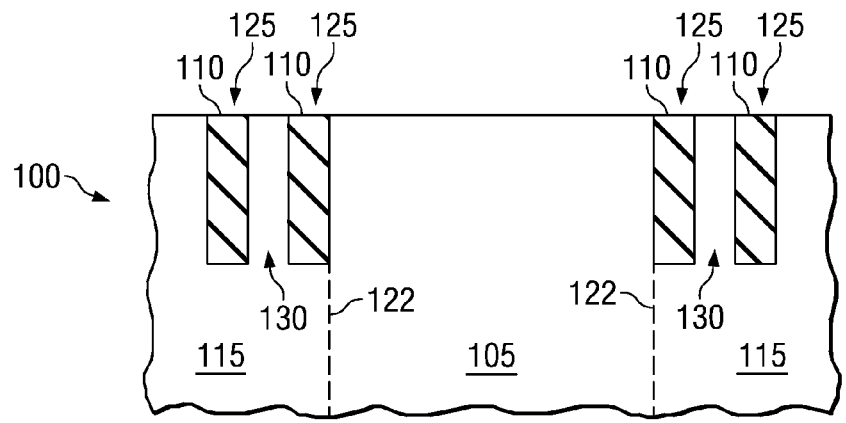
Figure 1C:
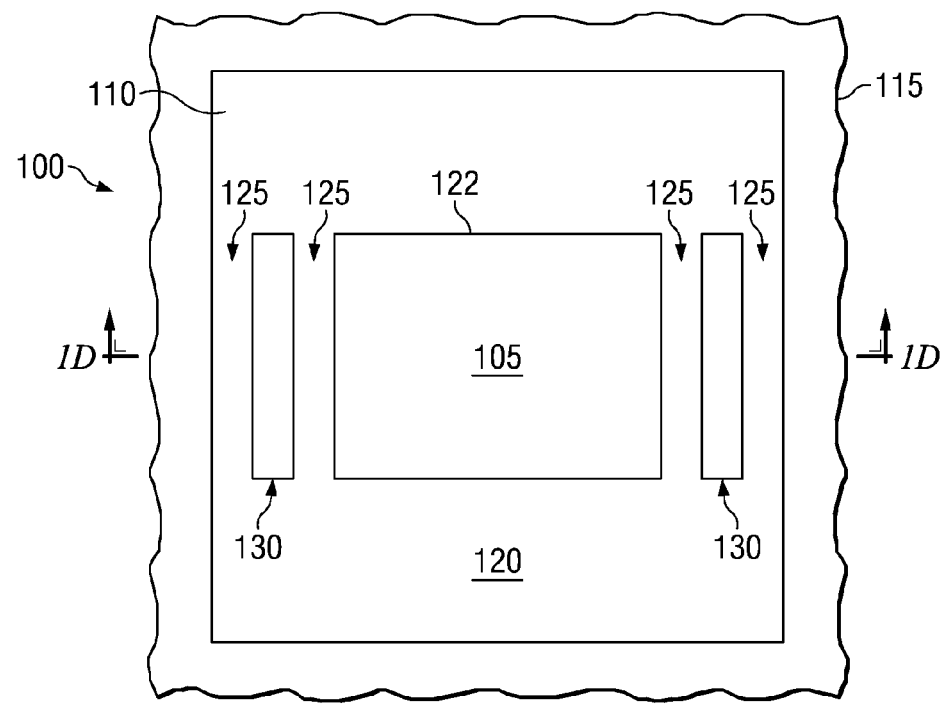
Figure 1E:
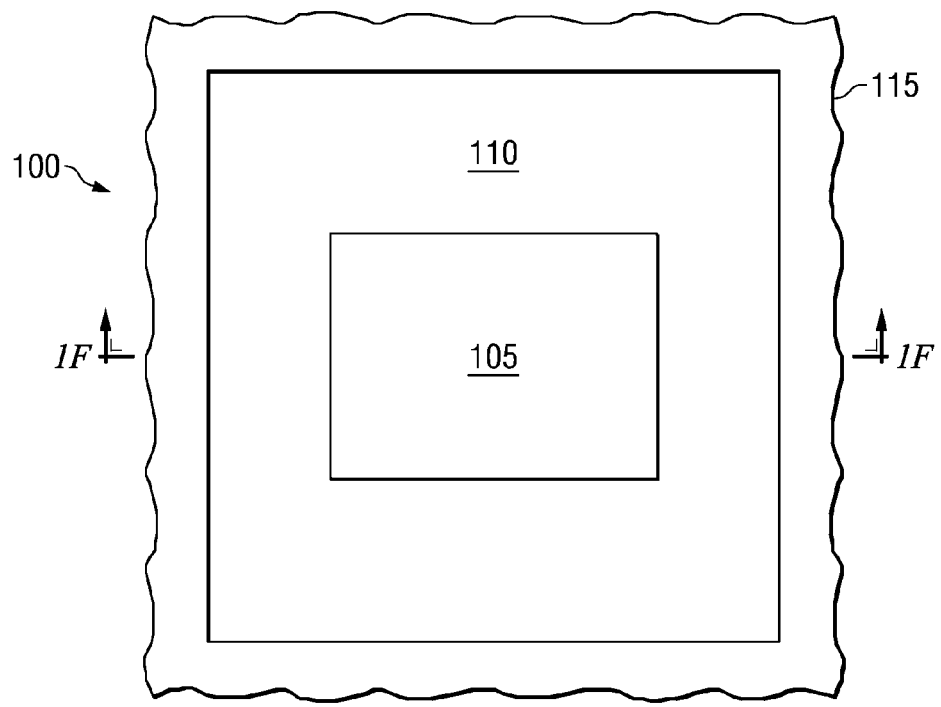
Figure 1F:
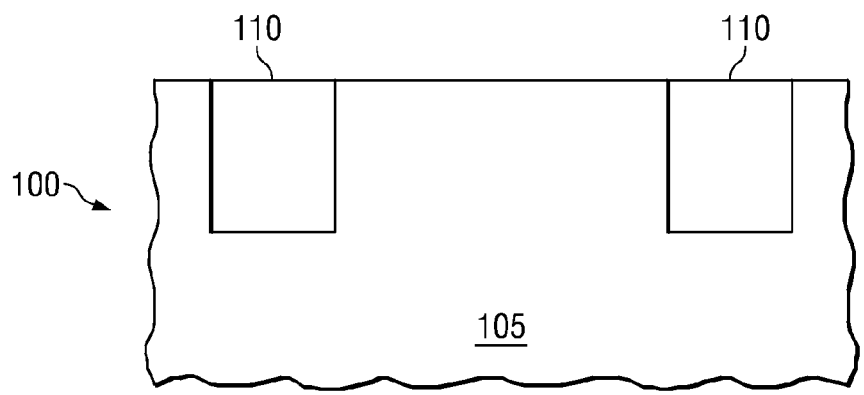
Figure 1G:
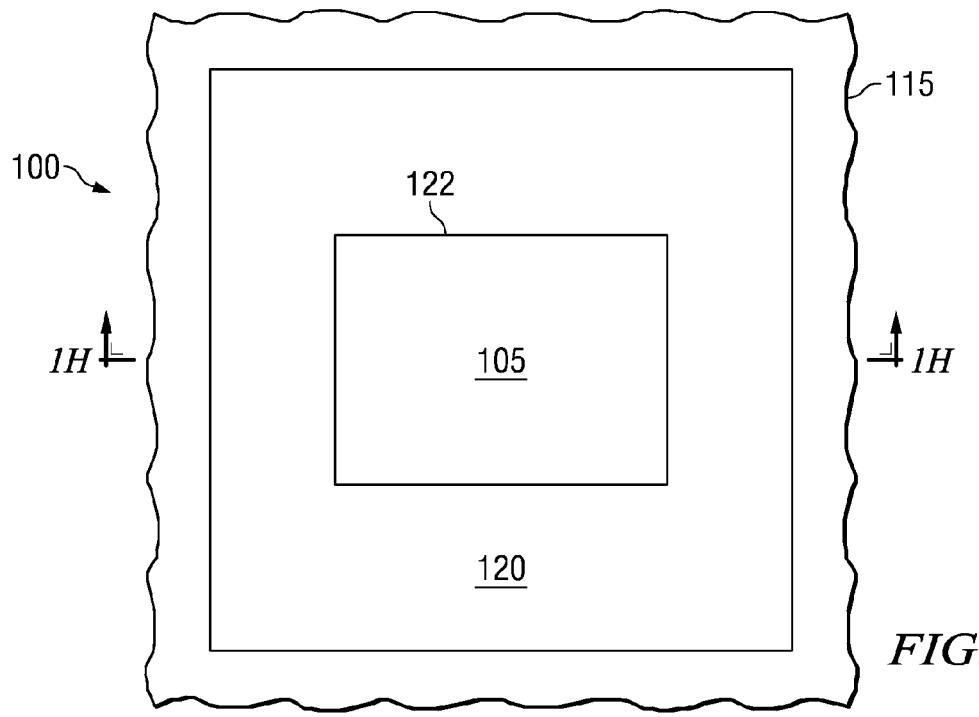
Figure 1H:
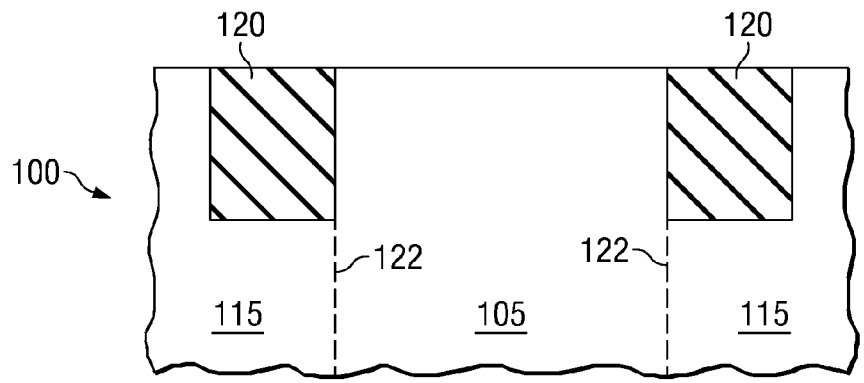
Figure 1I:
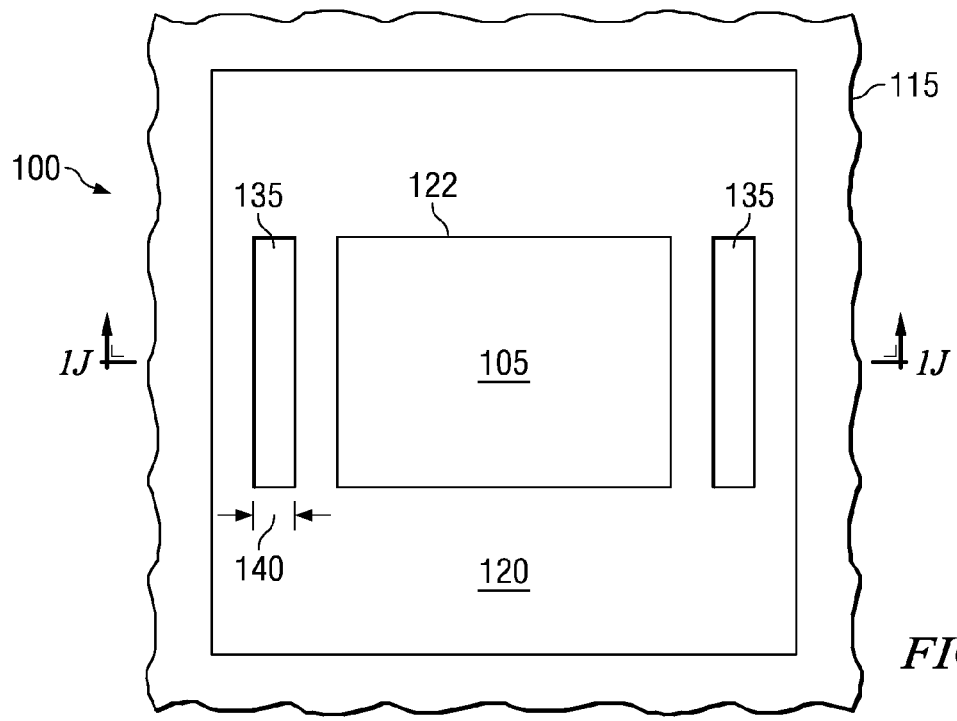
Figure 1J:
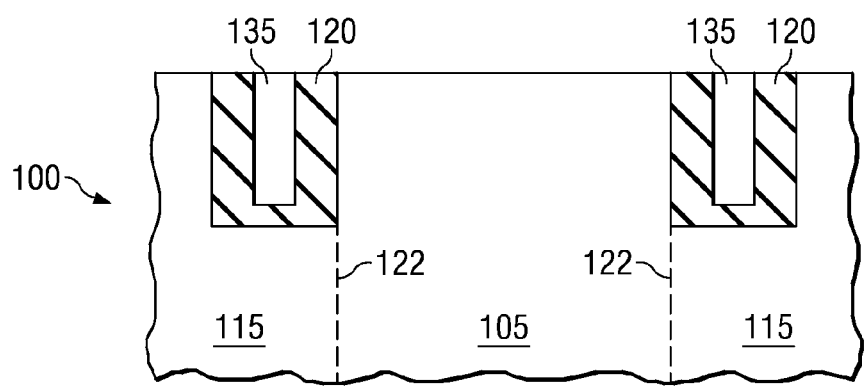
Figure 1L:
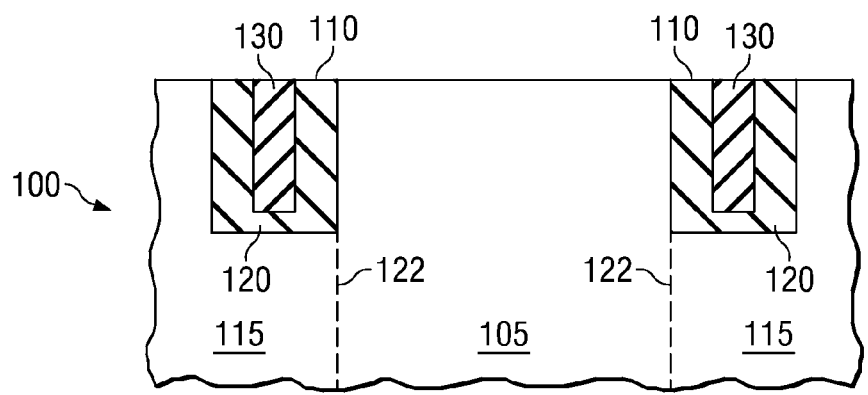
Figure 1K:
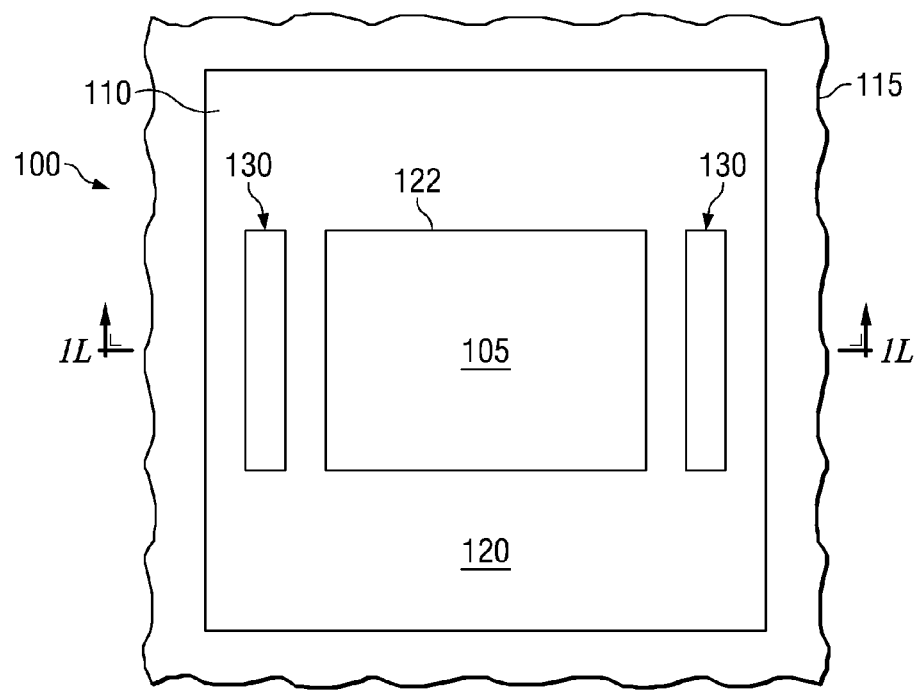
Figure 1M:
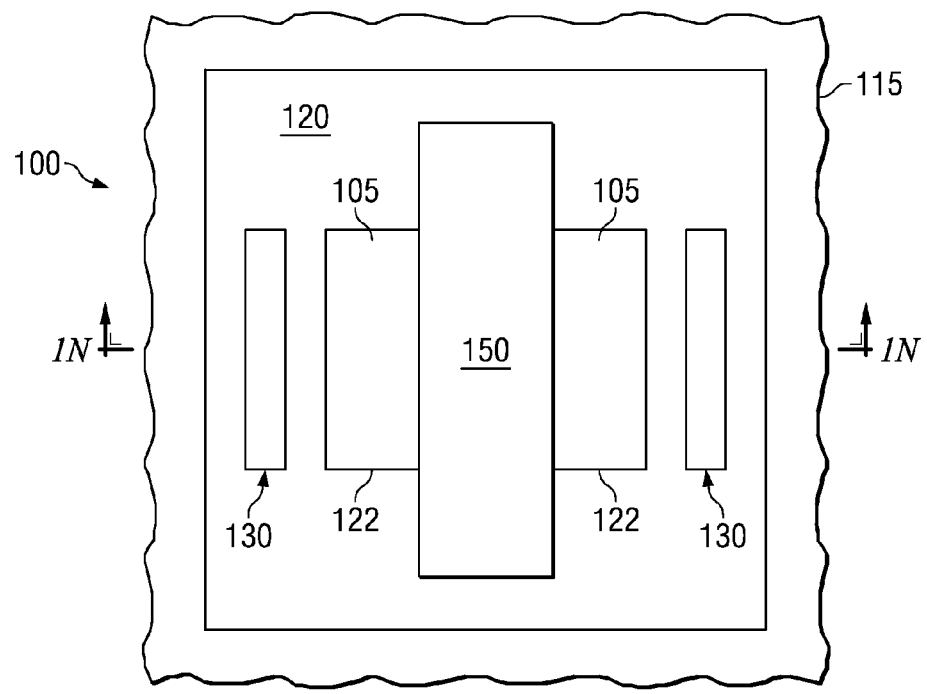
Figure 1N:
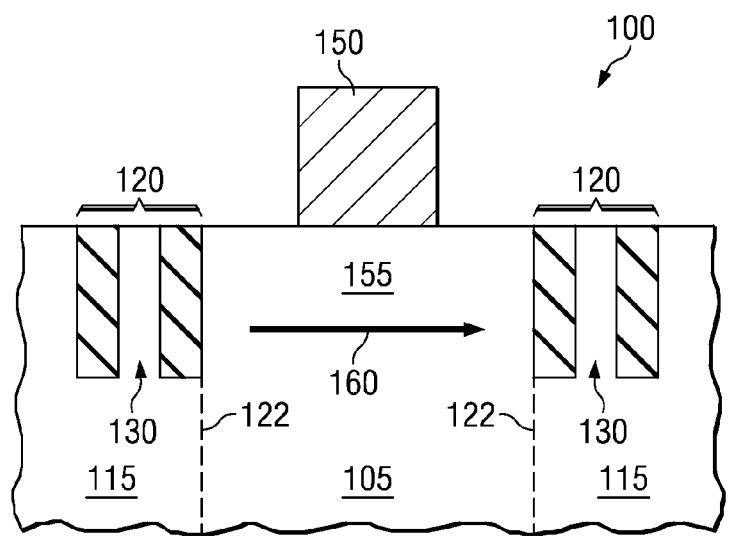

FIGS. 1A-1N illustrate steps in an example embodiment of a method for manufacturing a MOS transistor 100.

As shown in FIGS. 1A and 1B, defining an active area 105 includes forming a trench 110 in a substrate 115. The substrate 115 preferably comprises silicon. Conventional lithographic processes may be used to form the trench, including covering portions of substrate 115 with photoresist and etching uncovered portions with a wet or plasma etch. Conventional procedures can then be used to fill the trench 110 with an insulating material, such as silicon dioxide, to form an isolation structure 120, as shown in FIGS. 1C and 1D. The active area 105 is thereby bounded by the isolation structure 120, as represented by the dashed lines 122 (see FIG. 1D).

FIGS. 1A-1D also illustrate a preferred method to place a stress adjuster adjacent the active area. FIGS. 1A and 1B illustrate that forming the trench 110 includes removing portions of the silicon substrate 115 to form at least two trenches 125 to define a stress adjuster 130. As shown in FIGS. 1C and 1D, the two trenches 125 are filled with the insulating material of the isolation structure 120. The portion of silicon remaining between the trenches 125 is the stress adjuster 130.

FIGS. 1E-1L illustrate an alternative method to place a stress adjuster adjacent the active area. As shown in FIGS. 1E and 1F, a trench 110 is formed in a silicon substrate 115. Then, as shown in FIGS. 1G and 1H, the trench 110 is filled with an insulating material to form an isolation structure 120, thereby defining the boundary 122 around the active area 105. A portion of the isolation structure 120 is then removed, as shown in FIGS. 1I and 1J, using conventional procedures to form a trench 135 adjacent the active area 105, and preferably within the isolation structure 120. Next, as illustrated in FIGS. 1K and 1L, the trench 135 is filled with a material to form the stress adjuster 130.

With reference to FIG. 1I, in some preferred embodiments, the trench 135 is filled with an insulating material comprising silicon dioxide via a high density plasma (HDP) oxide deposition. HDP oxide deposition is preferred when the trench 135 has a narrow width 140, because this method is conducive to filling narrow structures (e.g., width 140 of less than about 150 nanometers). In other instances, however, other methods can be used to fill the trench 135, such as spin-on glass type oxides.

FIGS. 1M and 1N show the MOS transistor 100 after forming a gate 150 over the active area 105. Conventional oxidation, deposition and lithographic procedures can be used to deposit and pattern oxide and polysilicon layers to form the insulator and electrode of the gate 150. Of course, other well-known materials may also be included in the formation of the gate 150. The dimensions of the gate 150 define the dimensions of a channel region 155 in the active area 105 that is under the gate 150.

The material used to form the stress adjuster 130 is selected either to increase or decrease a compressive stress imparted from the isolation structure 120 to the channel region 155. For example, when the MOS transistor 100 is an NMOS transistor, it is desirable to decrease the compressive stress in an intended direction of current flow 160.

While not depicted in FIGS. 1A-1N, it is understood by those skilled in the art to which the invention relates that the manufacture of the MOS transistor 100 could also include conventional steps to form other transistor components, such as doped wells, source/drains and source/drain extensions and gate sidewall structures.

Figure 2A:
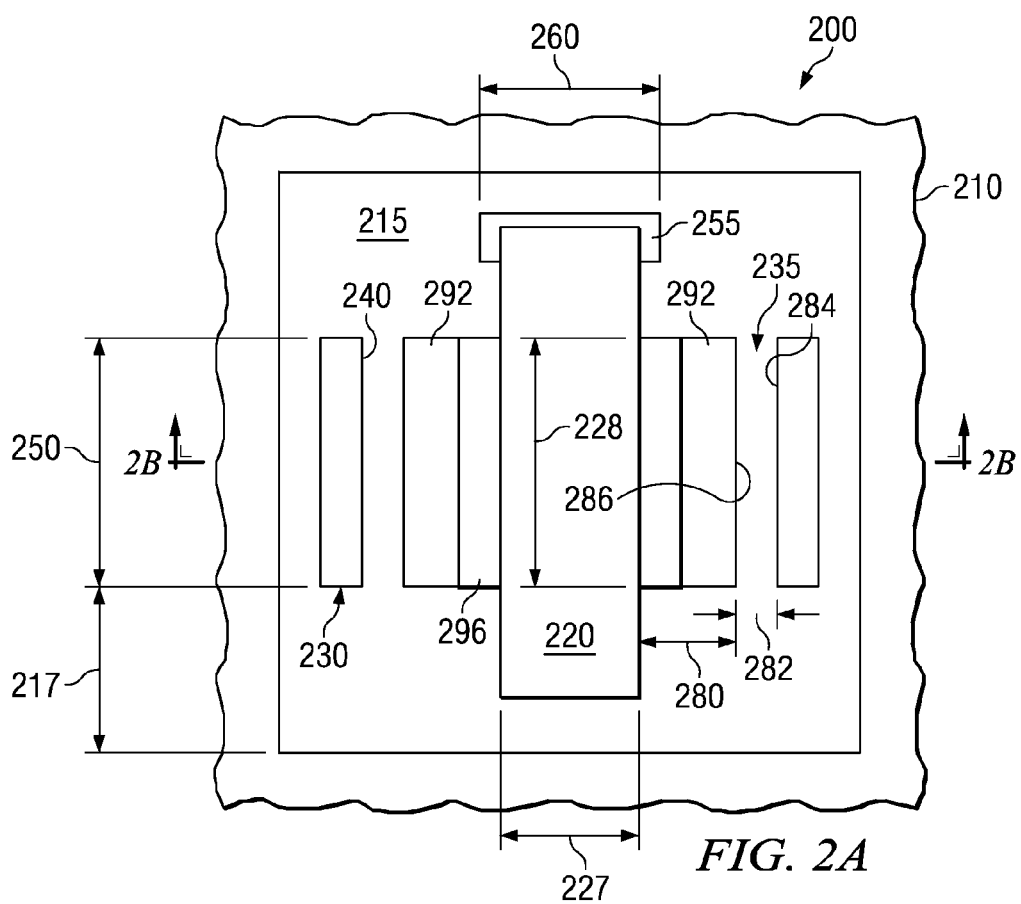
FIGS. 2A and 2B illustrate sectional and plan views, respectively, of an example MOS device according to principles of the invention.
Figure 2B:
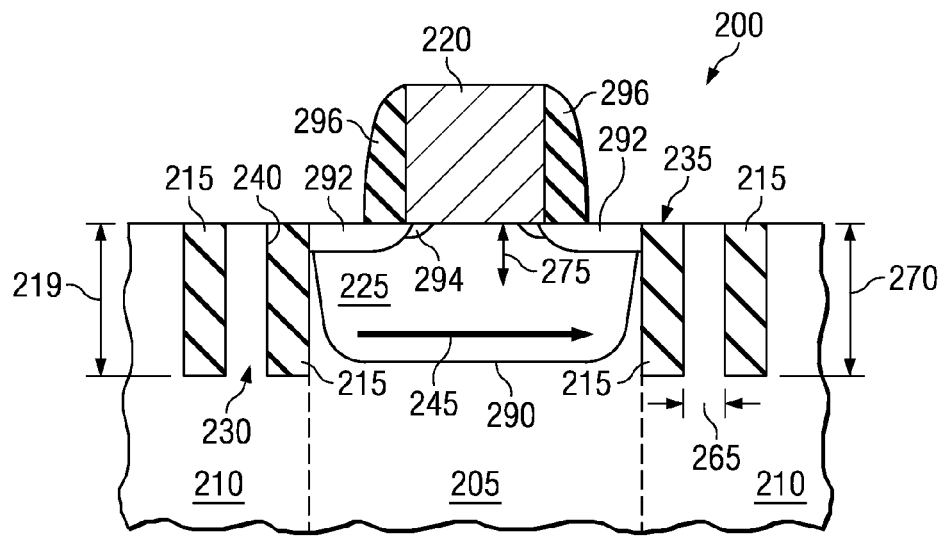

FIGS. 2A and 2B illustrate an example embodiment of a MOS transistor 200 according to the invention. Any of the above-described embodiments of the methods of manufacturing the MOS device 100, such as depicted in FIGS. 1A-1N, can be used to construct the MOS transistor 200.

The MOS transistor 200 comprises an active area 205 in a substrate 210 and an isolation structure 215. The isolation structure 215 is in the substrate 210 and surrounds the active area 205. For each technology node, minimum design rules specify the minimum dimensions of the isolation structure 215 needed to isolate the active area 205 from adjacent active areas (not shown). In some embodiments for instance, the isolation structure 215 is a shallow trench isolation (STI) structure, having a width 217 of at least about 50 to about 200 nanometers and a depth 219 of at least about 250 to about 400 nanometers. Of course, other shapes, widths 215 and depths 219 for the isolation structure 215 are also within the scope of the invention.

Preferred embodiments of the MOS transistor 200 also include a gate 220 located over the active area 205. A channel region 225 is located in the active area 205 under the gate 220. Similar to the isolation structure 215, design rules, well known to those skilled in the art, govern the dimensions of the gate 220 according to the desired performance characteristics of the transistor 200 for the technology node of interest. Typically, a gate length 227 is fixed for a particular technology node (e.g., 0.25 microns) and a gate width 228 is adjusted by the circuit designer to obtain the desired current.

The MOS transistor 200 also includes at least one stress adjuster 230 adjacent the active area 205. When the MOS transistor 200 includes a plurality of stress adjusters 230, the individual stress adjusters 230 can be composed of the same or different materials. For instance, the stress adjuster 230 can comprise a portion of the silicon substrate 210 or an insulating material, such as silicon dioxide.

The stress adjuster 230 is positioned to modify a mobility of a majority carrier within the channel region 225. Preferably, the stress adjuster 230 is positioned within the isolation structure 215, such that a portion 235 of the isolation structure 215 is between the active area 205 and the stress adjuster 230. In some cases, it is preferable for the stress adjuster 230 to be a long continuous block. Such a shape is effective at altering the compressive stress imparted from the isolation structure 215 to the entire channel region 225. This is in contrast to active dummy areas, which are generally small pillar-shaped structures to minimize parasitic capacitances.

In some embodiments, it is advantageous for a long dimension 240 of the stress adjuster 230 to be perpendicular to an intended direction of current flow 245. In such instances, it is desirable for the long dimension 240 of the stress adjuster 230 to have a length 250 substantially equal to the gate width 228, as this facilitates modification of the mobility of a majority carrier in the entire channel region 225. However, embodiments where there are a plurality of stress adjusters 230 between the active area 205 and isolation structure 215 are also within the scope of the present invention.

In other embodiments, it is advantageous to place the stress adjuster 230 such that its long dimension 255 is parallel to the intended direction of current flow 245. Such placements advantageously modify the extent of compressive stress imparted from regions of the isolation structure 215 that are 225 perpendicular to the intended direction of current flow 245. In such embodiments, it is desirable for the long dimension 255 to have a length 260 substantially equal to the gate length 227, as this facilitates modification of the mobility of the majority carrier in the channel region 225.

The thickness 265 and depth 270 of the stress adjuster 230 can also be adjusted to further modify the mobility of the majority carrier in the channel region 225. For example, in some embodiments, the thickness 265 of the stress adjuster 230 is least about 50 to about 500 nanometers. Such thicknesses are favored because they facilitate the ability of the stress adjuster 230 to modify the compressive stress from the isolation structure 215 to the channel region 225. In other embodiments, the depth 270 of stress adjuster 230 is substantially equal to the depth 219 of the isolation structure 215. In other cases, the depth 270 of stress adjuster 230 is substantially equal to the depth 275 of the channel region 225. Of course, the MOS transistor 200 of the present invention can include various combinations of differently oriented and dimensioned stress adjusters 230.

The shape and choice of material comprising the stress adjuster 230 depend upon the type of MOS transistor 200 desired. For instance, when the MOS transistor 200 is an NMOS transistor, it is desirable for the stress adjuster 230 to reduce a compressive stress to the channel 225. Such embodiments are particularly advantageous when an active overlap distance 280 is small (e.g., less than about 500 nanometers). Alternatively, when the MOS transistor 200 is a PMOS transistor, it is desirable for the stress adjuster 230 to increase a compressive stress to the channel 225.

It is preferable for the stress adjuster 230 to be near the active area 205 because this facilitates the ability of the stress adjuster to change the mobility of the majority carriers in the channel region 225. This is contrast to active dummy areas which are generally distant (e.g., at least about 1000 to about 2000 nanometers away) from active areas because the purpose of active dummy areas is to reduce dishing associated with chemical-mechanical polishing over the entire substrate surface. As noted above, the portion 235 of the isolation structure 215 is between the active area 205 and the stress adjuster 230. In some cases, a distance 282 between a perimeter 284 of the stress adjuster 230 and a perimeter 286 of the active area 205 is at least about 50 nanometers, and in some advantageous embodiments, between about 50 and about 300 nanometers.

As indicated above, the placement of one or more stress adjusters 230 adjacent the active area 205 can substantially alter the compressive stress imparted by the isolation structure 215 to the channel region 225. Consider, for instance a MOS transistor 200 having an active overlap of about 180 nanometers and bounded by a shallow trench isolation (STI) region 215 whose width 217 is about 600 nanometers. A silicon stress adjuster 230 is placed within the center of the STI region 215. The stress adjuster 230 has a width 265 of about 200 nanometers and a depth 270 that is substantially the same as the depth 219 of the STI region 215. Such a transistor has about 27 percent less compressive stress in a direction parallel with the direction of current flow 245, compared to a similar-dimensioned transistor having no stress adjuster.

Of course, the MOS transistor 200 can include other conventional device components, such as a well 290, source/drain structures 292, source/drain extensions 294 and sidewalls 296, to provide an operative transistor. The presence of one or more stress adjusters 230 can substantially improve the performance characteristics of the operative MOS transistor 200, as compared to an analogous transistor with no stress adjuster. For example, certain NMOS embodiments of the MOS transistor 200, having an active overlap distance 280 of less than about 500 nanometers, have an about 20 percent lower ratio of $I_{off}/I_{on}$, as compared to a similarly dimensioned transistor having no stress adjuster.

Figure 3:
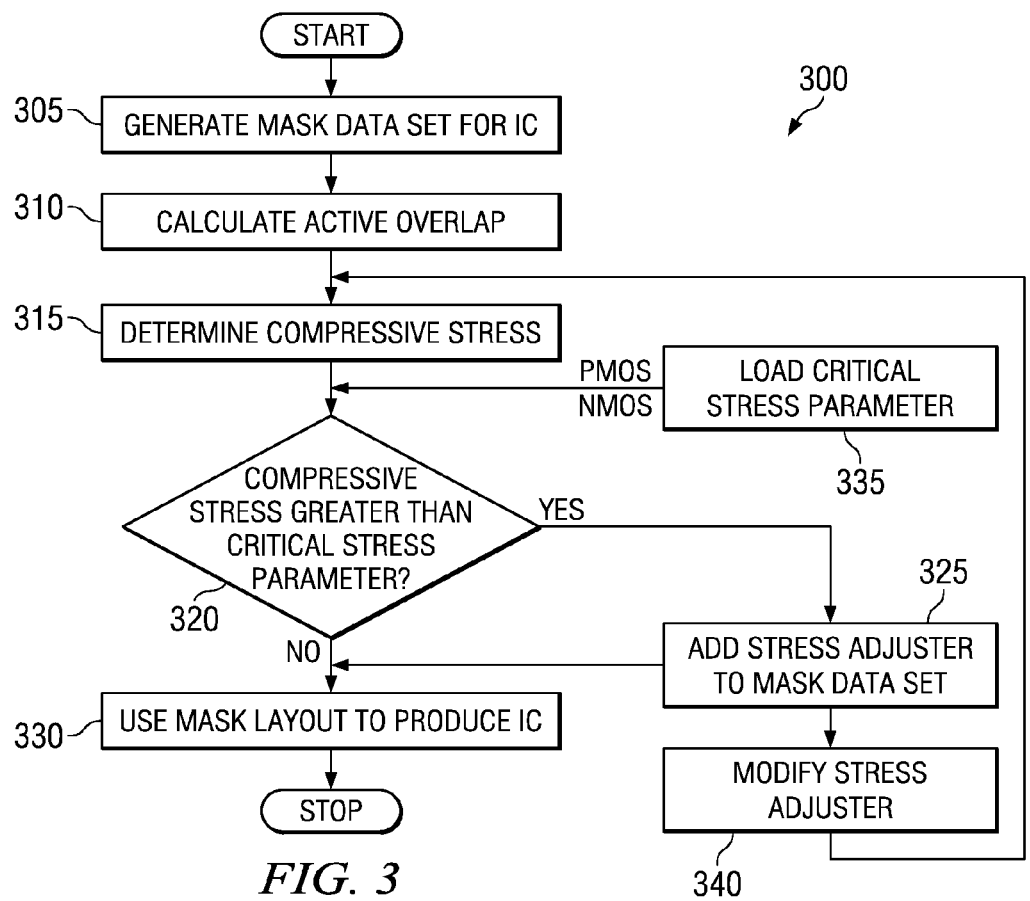
FIG. 3 illustrates by flow diagram a method for constructing an integrated circuit layout according to principles of the invention.

FIG. 3 illustrates by flow diagram, another embodiment of the invention, in the form of a process 300 for constructing an integrated circuit (IC). One skilled in the art would appreciate that the process 300 can be advantageously applied to the layout design of a variety of transistors or other semiconductor devices. As noted above, this embodiment is particularly advantageous when applied to control the performance characteristics of transistors for technology nodes where the active overlap of transistors is small.

The process 300 commences, at step 305 with the generation of a mask layout for the IC. The mask layout could include planned dimensions for active areas, gates and isolation structures, for example. An active overlap distance between a planned perimeter of a selected gate and a planned perimeter of a selected active area of the IC is calculated in step 310. Those skilled in the art would be familiar with conventional mathematical algorithms that can be used to facilitate this calculation.

In step 315, a compressive stress along a direction of an intended current flow through a planned channel of the IC is determined based on the active overlap distance. One skilled in the art would appreciate the variety of techniques that could be used to determine compressive stress. Such techniques could include, for example, determining the compressive stress based on conventional theoretical understanding of the factors causing stress. Alternatively, the compressive stress can be determined with the aid of an empirical database, where stresses have been measured in structures analogous to the instant transistor.

In step 320, it is ascertained whether or not the compressive stress determined in step 315 is greater than a critical stress parameter by comparing values. If the compressive stress is greater, then a stress adjuster area is introduced, in step 325, adjacent the active area to modify a mobility of a majority carrier through the planned channel. If the compressive stress is not greater, then the mask design is complete, and the mask design is used to produce the IC, as indicated in step 330.

The value of the critical stress parameter can be established by theoretical or empirical techniques, similar to that described for determining the compressive stress. It is preferable to load, in step 335, different critical stress parameters for different transistor types, for use in the comparison made in step 320. As an example, the critical stress parameter preferably is adjusted to different values, depending on whether mask layout data set under consideration defines an NMOS or a PMOS transistor.

The critical stress parameters may be different for different zones of the integrated circuit layout. Therefore, in certain embodiments, the comparison made in step 320 is facilitated by grouping or binning together all zones of the layout that have the same critical stress parameter. Of course other parameters, such as $I_{on}$ or transconductance ($G_m$), could be used as the basis for binning of zones. In other embodiments, it is advantageous to perform the process 300 on pairs of transistors that are coupled to each other in the IC. As an example, consider NMOS and PMOS transistors that are coupled together to form a CMOS device. The critical stress parameter for the PMOS transistor and the critical stress parameter for the NMOS transistor could be adjusted such that the PMOS and NMOS transistors have substantially the same on-current.

In some cases, it is desirable to express the compressive stress and critical stress parameter in units other than pressure. In some instances, the critical stress parameter corresponds to a predefined critical active overlap distance and the compressive stress corresponds the active overlap distance. For example, if the active overlap for the transistor of interest is less than a critical active overlap, then that transistor is a candidate for placing a stress adjuster. One skilled in the art would appreciate that other proxies for compressive stress could be used.

In cases where the placement of a stress adjuster is indicated, it can be desirable to modify the stress adjuster, in step 340. Any number of features of the stress adjuster can be modified to affect a change in the extent of compressive stress imparted from the isolation structure to the channel region of the transistor. For instance, increasing or decreasing one or more of the physical dimensions of the stress adjuster could modify the compressive stress. Moving the stress adjuster closer or farther from the active area could also alter the compressive stress. Changing the orientation of the stress adjuster so as to have a long dimension that is perpendicular, parallel or at intermediate angles, with respect to the intended direction of current flow through the channel, could also affect the compressive stress.

In some embodiments, it is advantageous for the modifications to the stress adjuster in step 340 to be determined in an iterative fashion. For instance, one or more of the above-described features of the stress adjuster could be modified by a predefined increment, and the determination of the compressive stress repeated in step 315, until the compressive stress is no longer greater than the critical stress parameter. During the course of this iterative process, additional stress adjusters could also be added, in step 325, if necessary.

Of course, the above-described process 300 could be applied to each active area in the IC layout. The process 300 could also include storing the mask layout data sets in temporary pattern generation (PG) files, checking for rule violations, and repeating the process until no rules are violated. In some embodiments, these temporary PG files are then stored in a master PG file that, in turn, is used to produce mask works using convention producers. The mask works are then used for the pattern transfer of different layers comprising the IC layout to a semiconductor substrate to produce the IC. Of course, the above-described process 300 could be equally applied to the production of ICs using direct-write technologies.

Although the invention have been described in detail in the context of example embodiments, those of ordinary skill in the art to which the invention relates should understand that they can make various changes, substitutions and alterations therein without departing from the scope of the invention.

What is claimed is:

1. A method of manufacturing a MOS transistor, comprising:
    forming a trench isolation structure of insulating material defining and surrounding an active area within a semiconductor substrate;
    forming a stress adjuster adjacent the active area within the trench isolation structure at a location between adjacent trench regions of the trench isolation structure;
    forming a gate structure over the active area; and
    forming source/drain regions on opposite sides of the gate structure within the active area;
    whereby a channel region is defined between the source/drain regions under the gate structure; and the stress adjuster acts to increase or decrease compressive stress imparted from the isolation structure to the channel region; and
    wherein the stress adjuster is formed by covering a part of the substrate between adjacent trench region portions of the trench isolation structure, with the adjacent trench region portions left uncovered; etching the uncovered adjacent trench region portions; and filling the etched adjacent trench region portions with insulating material; the covered part of the substrate being left unetched between the etched and filled adjacent trench region portions.

2. The method of claim 1, wherein the transistor is an NMOS transistor; and the stress adjuster is configured to decrease a compressive stress imparted from the isolation structure to the channel region.

3. The method of claim 1, wherein the transistor is a PMOS transistor; and the stress adjuster is configured to increase a compressive stress imparted from the isolation structure to the channel region.

4. The method of claim 1, wherein the stress adjuster is formed with a long dimension that is perpendicular to an intended direction of current flow; and the long dimension has a length substantially equal to a width of the gate width over the active area.

5. The method of claim 1, wherein the stress adjuster is formed with a long dimension that is parallel to an intended direction of current flow; and the long dimension has a length substantially equal to a gate length over the active area.

6. The method of claim 1, wherein a distance between a perimeter of the stress adjuster and a perimeter of the active area is at least about 50 nanometers.

7. The method of claim 1, wherein the stress adjuster comprises a portion of the silicon substrate.

8. The method of claim 1, wherein the transistor is an NMOS transistor; and the NMOS transistor has an active overlap of about 500 nanometers or less.

9. The method of claim 1, wherein the trench isolation structure is formed by covering portions of the substrate with photoresist; etching uncovered portions of the substrate; and filling the etched uncovered portions with insulating material.

* * * * *